US012563904B2

(12) United States Patent
Xiao

(10) Patent No.: US 12,563,904 B2
(45) Date of Patent: Feb. 24, 2026

(54) OLED DISPLAY PANEL AND METHOD OF PRODUCING OLED DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventor: Xiang Xiao, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 459 days.

(21) Appl. No.: 17/754,300

(22) PCT Filed: Mar. 10, 2022

(86) PCT No.: PCT/CN2022/080224
§ 371 (c)(1),
(2) Date: Mar. 29, 2022

(87) PCT Pub. No.: WO2023/164963
PCT Pub. Date: Sep. 7, 2023

(65) Prior Publication Data
US 2024/0057390 A1     Feb. 15, 2024

(30) Foreign Application Priority Data
Mar. 4, 2022     (CN) .......................... 202210210306.4

(51) Int. Cl.
*H10K 59/122*     (2023.01)
*H10K 59/12*     (2023.01)
*H10K 59/80*     (2023.01)

(52) U.S. Cl.
CPC ....... *H10K 59/122* (2023.02); *H10K 59/1201* (2023.02); *H10K 59/80515* (2023.02)

(58) Field of Classification Search
CPC ............ H10K 59/122; H10K 59/1201; H10K 59/805; H10K 59/8051; H10K 59/80515;
(Continued)

(56) References Cited

U.S. PATENT DOCUMENTS

2009/0115326 A1     5/2009  Chan et al.
2010/0176717 A1     7/2010  Lee et al.
(Continued)

FOREIGN PATENT DOCUMENTS

CN     101013745 A     8/2007
CN     104716164 A     6/2015
(Continued)

OTHER PUBLICATIONS

International Search Report in International application No. PCT/CN2022/080224, mailed on Nov. 28, 2022.
(Continued)

*Primary Examiner* — Natalia A Gondarenko
(74) *Attorney, Agent, or Firm* — PV IP PC; Christopher S. Ruprecht; Wei Te Chung

(57)          ABSTRACT
Embodiments of the present disclosure are directed to an OLED display panel and a production method. The OLED display panel includes a driving backplate, an anode arranged at a side of the driving backplate, a light-emitting layer disposed at a side of the anode away from the driving backplate, and a cathode arranged at a side of the light-emitting layer away from the anode. The light-emitting layer has different light-emitting angles for the different areas on the light-emitting layer itself. The range of the light-emitting angle of the light-emitting layer is expanded, and the visible angle of the OLED display panel is enhanced as well.

18 Claims, 7 Drawing Sheets

(58) Field of Classification Search
    CPC ....... H10K 59/180517; H10K 59/8052; H10K
             59/80521; H10K 59/80523; H10K 59/23;
             H10K 59/1213; H10K 50/805; H10K
             50/81; H10K 50/813; H10K 50/818;
             H10K 50/82; H10K 50/822; H10K
             50/828
    USPC ........................... 257/40, 59, 27.119; 438/34
    See application file for complete search history.

(56)             References Cited

U.S. PATENT DOCUMENTS

| | | |
|---|---|---|
| 2011/0297943 A1 | 12/2011 | Kim et al. |
| 2017/0278913 A1* | 9/2017 | Zhang .................. H10K 59/876 |
| 2020/0013985 A1* | 1/2020 | Park ................. H10K 59/80515 |
| 2022/0115622 A1* | 4/2022 | Zhang .................... H10K 59/35 |
| 2022/0216447 A1* | 7/2022 | Liu ...................... H10K 59/124 |
| 2024/0381704 A1* | 11/2024 | Sasagawa ............ H10K 59/122 |

FOREIGN PATENT DOCUMENTS

| | | |
|---|---|---|
| JP | 2002008870 A | 1/2002 |
| KR | 100952831 B1 | 4/2010 |

OTHER PUBLICATIONS

Written Opinion of the International Search Authority in International application No. PCT/CN2022/080224, mailed on Nov. 28, 2022.
Chinese Office Action issued in corresponding Chinese Patent Application No. 202210210306.4 dated Jan. 20, 2023, pp. 1-6.

* cited by examiner

20

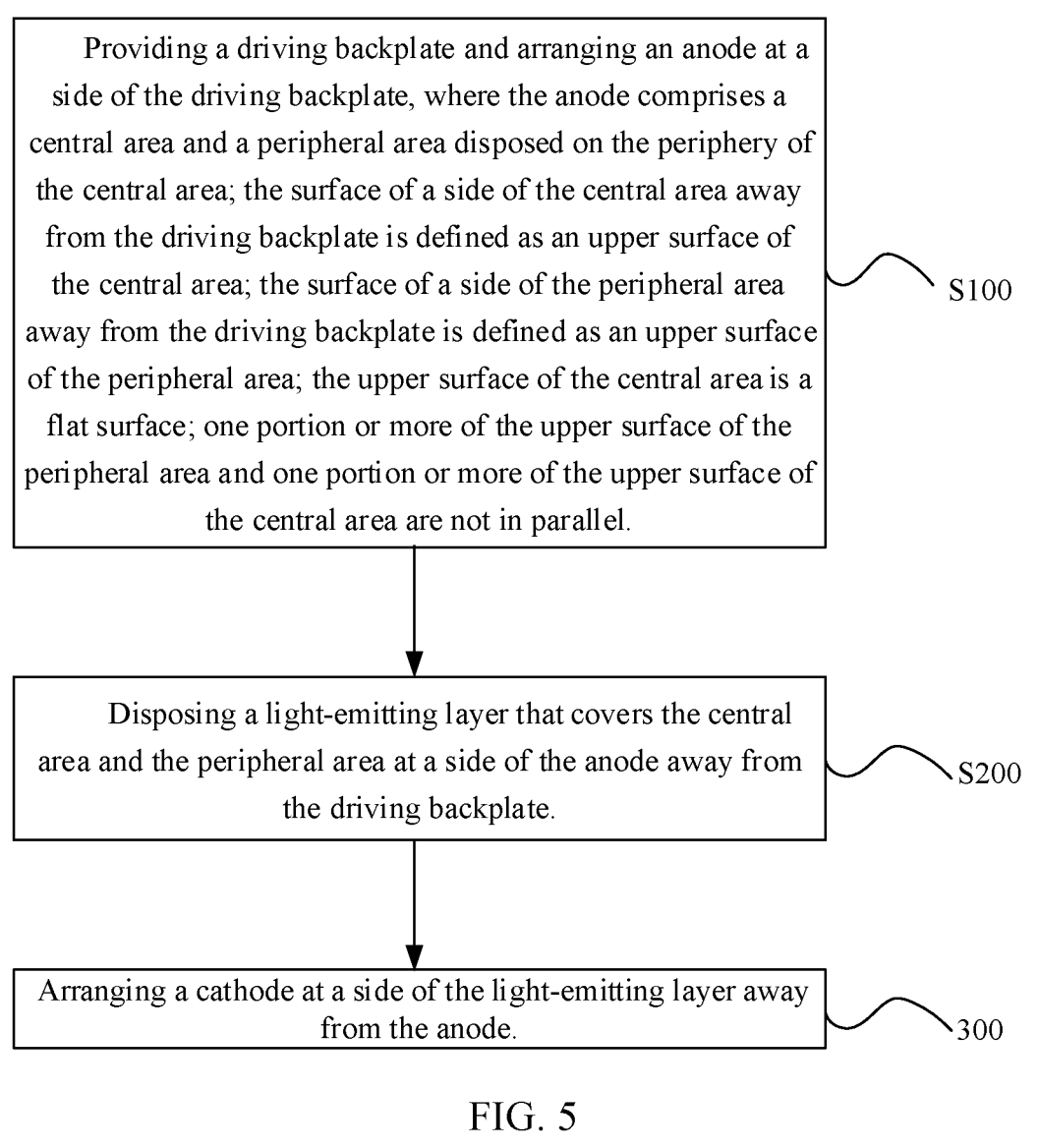

Providing a driving backplate and arranging an anode at a side of the driving backplate, where the anode comprises a central area and a peripheral area disposed on the periphery of the central area; the surface of a side of the central area away from the driving backplate is defined as an upper surface of the central area; the surface of a side of the peripheral area away from the driving backplate is defined as an upper surface of the peripheral area; the upper surface of the central area is a flat surface; one portion or more of the upper surface of the peripheral area and one portion or more of the upper surface of the central area are not in parallel.　　　　S100

Disposing a light-emitting layer that covers the central area and the peripheral area at a side of the anode away from the driving backplate.　　　　S200

Arranging a cathode at a side of the light-emitting layer away from the anode.　　　　300

FIG. 5

OLED DISPLAY PANEL AND METHOD OF PRODUCING OLED DISPLAY PANEL

FIELD OF THE DISCLOSURE

The present disclosure relates to display technology, and more particularly, to an organic light-emitting diode (OLED) display panel and a production method of the OLED display panel.

BACKGROUND

With the continuous development of science and technology, more and more electronic devices with display functions are widely applied in our daily lives and daily work. It has brought great convenience for our daily lives and work, making it an indispensable tool today. For the electronic device, the key component with a function of display for the display device is the display panel.

An organic light-emitting diode (OLED) display panel is one of the mainstream display panels in recent years. The OLED display panel has features of auto-luminescence, simple structure, super thinness, swift response time, wide viewing angles, low power consumption, and easily flexible display so it is widely utilized in the display field. However, an eminent direction of each area on a light-emitting layer in the OLED display panel of the related art is uniform so visible angles of the OLED display panel is narrower. When a user sees images shown on the display panel from one side of the display panel, distortion easily happens, resulting in a poorer display effect upon the images.

SUMMARY

Technical Problem

An object of the present disclosure is to propose an organic light-emitting diode (OLED) display panel and a production method of the OLED display panel. The light-emitting angles of different areas on the light-emitting layer in the OLED display panel are different, the light-emitting angle of the light-emitting layer ranges wider, and further, the visible angel of the light-emitting layer ranges to a larger extent. An image that the user sees on the display panel from different directions is more consistent, and the display effect upon the images is better.

Technical Solution

According to a first aspect of the present disclosure, an organic light-emitting diode (OLED) display panel includes a driving backplate, an anode arranged at a side of the driving backplate, a light-emitting layer disposed at a side of the anode away from the driving backplate, and a cathode, arranged at a side of the light-emitting layer away from the anode.

The anode comprises a central area and a peripheral area arranged around the periphery of the central area; the light-emitting layer covers the central area and the periph-eral area. A surface of a side of the central area away from the driving backplate is defined as an upper surface of the central area. A surface of a side of the peripheral area away from the driving backplate is defined as an upper surface of the peripheral area. One portion or more of the upper surface of the peripheral area and one portion or more of the upper surface of the central area are not in parallel.

Optionally, the distance between the upper surface of the peripheral area and the driving backplate gradually decreases from a side of the peripheral area near the central area to the peripheral area away from the central area.

Optionally, the peripheral area comprises a first area, a second area, a third area, and a fourth area. The first area, the second area, the third area, and the fourth area are sequen-tially connected from a first order to a last order; the first area corresponds to the third area in arrangement. The second area corresponds to the fourth area in arrangement.

The upper surface of the first area, the upper surface of the second area, the upper surface of the third area, and the upper surface of the fourth area are all flat surfaces. The angle formed by the upper surface of the first area and the upper surface of the central area, the angle formed by the upper surface of the second area and the upper surface of the central area, the angle formed by the upper surface of the third area and the upper surface of the central area, and the angle formed by the upper surface of the fourth area, and the upper surface of the central area are all blunt angles.

Optionally, an angle formed by the upper surface of the first area and the driving backplate is equal to an angle formed by the upper surface of the third area and the driving backplate.

Optionally, an angle formed by the upper surface of the second area and the driving backplate is equal to an angle formed by the upper surface of the fourth area and the driving backplate.

Optionally, an angle formed by an upper surface of the first area and an upper surface of the central area is not equal to an angle formed by an upper surface of the third area and the upper surface of the central area.

Optionally, an angle formed by an upper surface of the second area and an upper surface of the central area is not equal to an angle formed by an upper surface of the fourth area and the upper surface of the central area.

Optionally, the upper surface of the peripheral area is a curved surface.

Optionally, the thickness of the portion of the light-emitting layer covering the central area is equal to the thickness of the portion of the light-emitting layer covering the portion of the peripheral area.

Optionally, the OLED display panel further comprises a pixel definition layer disposed on the driving backplate. An opening is disposed on the pixel definition layer; the anode and the light-emitting layer are arranged inside the opening; the cathode covers a side of the light-emitting layer away from the driving backplate and a side of the pixel definition layer away from the driving backplate.

According to a second aspect of the present disclosure, a method of producing an organic light-emitting diode (OLED) display panel includes providing a driving back-plate and arranging an anode at a side of the driving backplate. The anode comprises a central area and a periph-eral area disposed on the periphery of the central area. The surface of a side of the central area away from the driving backplate is defined as an upper surface of the central area. The surface of a side of the peripheral area away from the driving backplate is defined as an upper surface of the peripheral area. The upper surface of the central area is a flat surface. One portion or more of the upper surface of peripheral area and one portion or more of the upper surface of the central area are not in parallel.

The method further includes disposing a light-emitting layer that covers the central area and the peripheral area at a side of the anode away from the driving backplate, and arranging a cathode at a side of the light-emitting layer away from the anode.

Optionally, the distance between the upper surface of the peripheral area and the driving backplate gradually decreases from a side of the peripheral area near the central area to the peripheral area away from the central area.

Optionally, the peripheral area comprises a first area, a second area, a third area, and a fourth area. The first area, the second area, the third area, and the fourth area are sequentially connected from a first order to a last order; the first area corresponds to the third area in arrangement. The second area corresponds to the fourth area in arrangement.

The upper surface of the first area, the upper surface of the second area, the upper surface of the third area, and the upper surface of the fourth area are all flat surfaces. The angle formed by the upper surface of the first area and the upper surface of the central area, the angle formed by the upper surface of the second area and the upper surface of the central area, the angle formed by the upper surface of the third area and the upper surface of the central area, and the angle formed by the upper surface of the fourth area, and the upper surface of the central area are all blunt angles.

Optionally, an angle formed by the upper surface of the first area and the driving backplate is equal to an angle formed by the upper surface of the third area and the driving backplate.

Optionally, an angle formed by the upper surface of the second area and the driving backplate is equal to an angle formed by the upper surface of the fourth area and the driving backplate.

Optionally, an angle formed by an upper surface of the first area and an upper surface of the central area is not equal to an angle formed by an upper surface of the third area and the upper surface of the central area.

Optionally, an angle formed by an upper surface of the second area and an upper surface of the central area is not equal to an angle formed by an upper surface of the fourth area and the upper surface of the central area.

Optionally, the upper surface of the peripheral area is a curved surface.

Optionally, a shape of the curved surface is a circular arc or an elliptical curve.

Advantageous Effect

The OLED display panel proposed by the embodiment of the present disclosure has some merits as follows. The OLED display panel includes an anode. The anode includes a central area and a peripheral area. The anode is arranged on the OLED display panel. One portion or more of an upper surface of the peripheral area and one portion or more of an upper surface of the central area are not in parallel. The light-emitting layer directly covers the anode so the portion of the light-emitting layer corresponding to the central area and the portion of the light-emitting layer corresponding to the peripheral area are not in parallel. The light emitted by the light-emitting layer is substantially perpendicular to the surface of the light-emitting layer, so the light-emitting angle of the light-emitting layer corresponding to the portion of the central area differs from the light-emitting angle of the light-emitting layer corresponding to the portion of the peripheral area. In other words, the light-emitting layer has different light-emitting angles for the different areas on the light-emitting layer itself. The range of the light-emitting angle of the light-emitting layer is expanded, and the visible angle of the OLED display panel is enhanced as well. An image shown from a lateral side of the display panel is basically consistent with the image shown from the front side of the display device when the user sees the image, and the display effect upon the images is better.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

FIG. 5 illustrates a flowchart of a method of producing an OLED display panel according to another embodiment of the present disclosure.

DETAILED DESCRIPTION OF THE EMBODIMENTS

Figure 1:
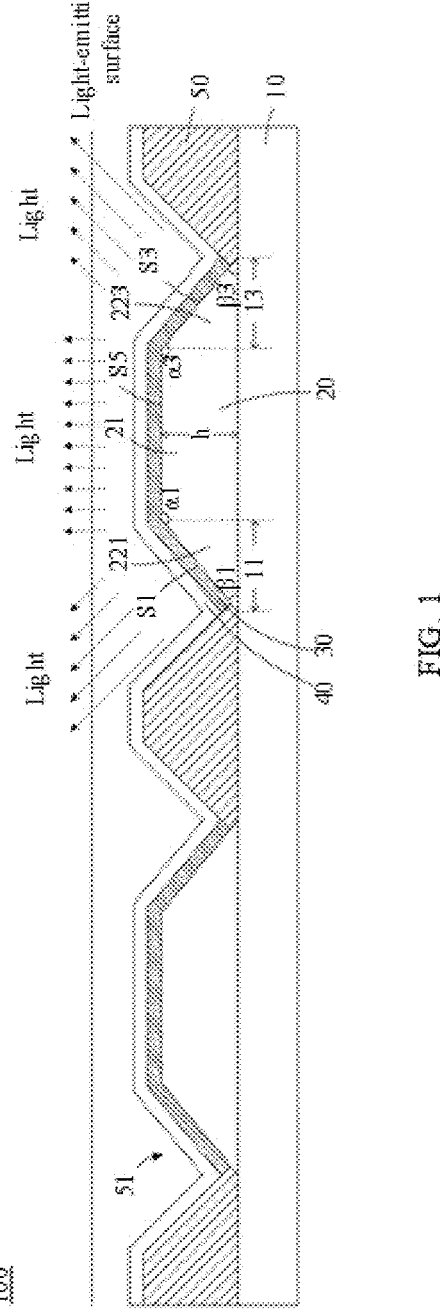
FIG. 1 illustrates a top view of an OLED display panel according to a first embodiment of the present disclosure.

The invention is described below in detail with reference to the accompanying drawings, wherein like reference numerals are used to identify like elements illustrated in one or more of the figures thereof, and in which exemplary embodiments of the invention are shown. This invention may, however, be embodied in many different forms and should not be construed as limited to the particular embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

Figure 2:
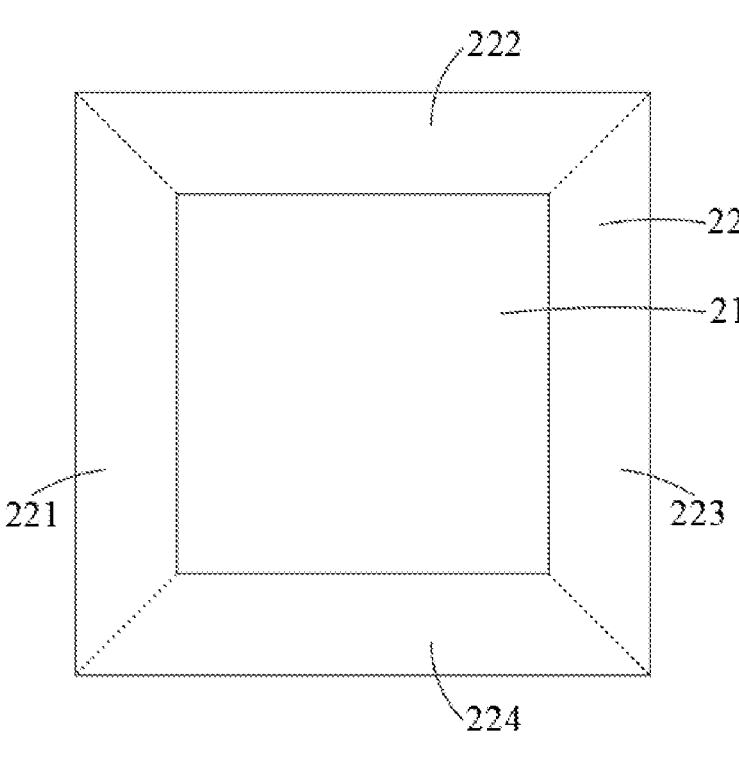
FIG. 2 illustrates a top view of aa anode of an OLED display panel as shown in FIG. 1.

Please refer to FIG. 1 to FIG. 2. FIG. 1 is a cross-sectional diagram of an organic light-emitting diode (OLED) display panel according to a first preferred embodiment of the present disclosure. FIG. 2 is a top view of an anode in the OLED display panel, as illustrated in FIG. 1. The OLED display panel 100 proposed by the present embodiment includes a driving backplate 10, an anode 20, a light-emitting layer 30, and a cathode 40. The anode 20 is arranged at one side of the driving backplate 10. The light-emitting layer 30 is arranged at one side of the anode 20 away from the driving backplate 10. The cathode 40 is arranged at one side of the light-emitting layer 30 away from the anode 20.

The anode 20 includes a central area 21 and a peripheral area 22. The peripheral area 22 is arranged around the periphery of the central area 21. The light-emitting layer 30 covers the central area 21 and the peripheral area 22. The surface of one side of the central area 21 away from the driving backplate 10 is defined as an upper surface S5 of the central area 21. The surface of one side of the peripheral area 22 away from the driving backplate 10 is defined as an upper surface of the peripheral area 22. Especially, one portion or more of the upper surface of the peripheral area 22 and one portion or more of the upper surface S5 of the central area 21 are not in parallel.

The peripheral area 22 includes a first area 221, a second area 222, a third area 223, and a fourth area 224. The first area 221, the second area 222, the third area 223, and the fourth area 224 are sequentially connected from the first to last order. The first area 221 corresponds to the third area 223 in arrangement. The second area 222 corresponds to the fourth area 224 in arrangement.

The upper surface S5 of the central area 21 may be a flat surface. In another preferred embodiment of the present disclosure, an upper surface S5 of a central area 21 may be a depression and/or a protrusion. Or, the upper surface S5 of the central area 21 may be a depressed curve toward one side of the driving backplate 10. Otherwise, the upper surface S5 of the central area 21 may be a protrusive curve toward one side of the light-emitting layer 30.

The upper surface of the driving backplate 10 is a flat surface. (The upper surface of the driving backplate 10 is the driving backplate 10 toward one side of the surfaces of the anode 20.) The upper surface S5 of the central area 21 is parallel to the upper surface of the driving backplate 10.

The peripheral area 22 may be disposed around the central area 21, and the shape of the peripheral area 22 presents closed. Otherwise, the peripheral area 22 is arranged at one side of the central area 21, both sides of the central area 21, or multiple sides of the central area 21.

For example, a thin film transistor (TFT) is arranged in the driving backplate 10. The TFT is electrically connected to the anode 20.

The area of the positive projection of the central area 21 on the driving backplate 10 may be greater than the area of the positive projection of the peripheral area 22 on the driving backplate 10. Alternatively, the area of the positive projection of the central area 21 on the driving backplate 10 is equal to the area of the peripheral area 22 on the driving backplate 10. In another way, the area of the positive projection of the central area 21 on the driving backplate 10 is less to the area of the peripheral area 22 on the driving backplate 10.

The OLED display panel 100 proposed by the embodiment of the present disclosure displays some characteristics. The anode 20, which includes the central area 21 and the peripheral area 22, is arranged on the OLED display panel 100. One portion or more of the upper surface of the peripheral area 22 and one portion or more of the upper surface S5 of the central area 21 are not in parallel. The light-emitting layer 30 directly covers the anode 20 so the portion of the light-emitting layer 30 corresponding to the central area 21 and the portion of the light-emitting layer 30 corresponding to the peripheral area 22 are not in parallel. The light emitted by the light-emitting layer 30 is substantially perpendicular to the surface of the light-emitting layer 30, so the light-emitting angle of the light-emitting layer 30 corresponding to the portion of the central area 21 differs from the light-emitting angle of the light-emitting layer 30 corresponding to the portion of the peripheral area 22. In other words, the light-emitting layer 30 has different light-emitting angles for the different areas of the light-emitting layer 30 itself. The range of the light-emitting angle of the light-emitting layer 30 is expanded, and the visible angle of the OLED display panel 100 is enhanced as well. An image shown from a lateral side of the display panel is basically consistent with the image shown from the front side of the display device when the user sees the image, and the display effect upon the images is better.

The visible angle of the OLED display panel of the related art is generally about 120 degrees (120°). Compared with the OLED display panel of the related art, the visible angle of the OLED display panel proposed by the present disclosure is up to 125° to 130° by innovating the shape of the anode 20 to enlarge the range of the light-emitting angle of the light-emitting layer 30. In this way, the consistency of the display effect of the display panel upon images improves when the user watches the images on the display panel from different directions.

The distance between the upper surface of the peripheral area 22 and the driving backplate 10 gradually decreases from the side of the peripheral area 22 to the central area 21 near the peripheral area 22 away from the central area 21. In other words, the upper surface of the peripheral area 22 is tilted in arrangement so the portion of the light-emitting layer 30 corresponding to the peripheral area 22 is also tilted in arrangement. The light emitted by the light-emitting layer 30 is substantially perpendicular to the surface of the light-emitting layer 30, the light emitted by the light-emitting layer 30 corresponding to the portion of the peripheral area 22 is different from the light emitted by the light-emitting layer 30 corresponding to the portion of the peripheral area 22. In addition, the peripheral area 22 is arranged around the central area 21 so the light-emitting layer 30 corresponding to different light-emitting angles of the peripheral area 22 on different positions as well. Therefore, it is advantageous to expand the range of the light-emitting angle of the light-emitting layer 30 and then enhance the visible angle of the OLED display panel 100.

The upper surface S1 of the first area 221, the upper surface of the second area 222, the upper surface S3 of the third area 223, and the upper surface of the fourth area 224 may be all flat surfaces. Besides, the angle α1 formed by the upper surface S1 of the first area 221 and the upper surface S5 of the central area 21, the angle formed by the upper surface of the second area 222 and the upper surface S5 of the central area 21, the angle α3 formed by the upper surface S3 of the third area 223 and the upper surface S5 of the central area 21, and the angle formed by the upper surface of the fourth area 224 and the upper surface S5 of the central area 21 are all blunt angles (i.e., more than 90° and less than 180°) such as 100°, 110°, 120°, 130°, 140°, 150°, 160°, 170°, etc. The upper surface of the first area 221, the upper surface of the second area 222, the upper surface S3 of the third area 223, and the upper surface of the fourth area 224 are all tilted surfaces. The first area 221 corresponds to the third area 223 in arrangement, and the second area 222 corresponds to the fourth area 224 in arrangement. So, the light-emitting angle of the light-emitting layer 30 corresponds to different portions of the first area 221, the second area 222, the third area 223, and the fourth area 224 totally differently. Additionally, the light-emitting angle of the light-emitting layer 30 corresponds to different areas of the upper surface of the peripheral area 22 totally differently. So the range of the light-emitting angle of the light-emitting layer 30 is greatly enlarged, and the visible angle of the OLED display panel 100 is expanded as well.

The thickness of the central area 21 of the anode 20 is defined as h. The width of the positive projection of the upper surface S1 of the first area 221 of the peripheral area 22 on the driving backplate 10 is defined as 11. The width of the front surface S3 of the third area 223 of the peripheral area 22 on the driving backplate 10 is defined as 13. It is appreciated that the ratio of the thickness h and the width 11 is controlled by adjusting the angle β1 between the upper surface S1 of the first area 221 and the driving backplate 10. The ratio of the thickness h and the width 13 is controlled by adjusting the angle β3 between the upper surface S1 of the first area 221 and the driving backplate 10. When the angle β1 changes, the tilting degree of the upper surface S1 of the first area 221 changes, which in turn makes it possible to change the light-emitting angle of the light-emitting layer 30 covering the first area 221. When the angle β3 changes, the tilting degree of the upper surface S3 of the third area 223 changes, which in turn makes it possible to change the light-emitting angle of the light-emitting layer 30 covering the third area 223. That is to say, the range of the light-emitting angle of the light-emitting layer 30 is adjusted by adjusting the magnitude of the angle β1 and the angle β3, and further the range of the visible angle of the OLED display panel 100 is adjusted.

An angle α1 formed by the upper surface S1 of the first area 221 and the upper surface S5 of the central area 21 is equal to an angle α3 formed by the upper surface S3 of the third area 223 and the upper surface S5 of the central area 21. As FIG. 1 illustrates, when the angle α1 is equal to the angle α3, the angle β1 formed by the upper surface S1 of the first area 221 and the driving backplate 10 is equal to an angle β3 formed by the upper surface S3 of the third area 223 and the driving backplate 10. In addition, the width 11 of the positive projection of the upper surface S1 of the first area 221 on the driving backplate 10 is equal to the width 13 of the positive projection of the upper surface S3 of the third area 223 on the driving backplate 10. It is appreciated that at this time, the first area 221 and the third area 223 are symmetrically arranged with respect to the central area 21.

For example, the angle α2 formed by the upper surface of the second area 222 and the upper surface S5 of the central area 21 is equal to the angle α4 formed by the upper surface of the fourth area 224 and the upper surface S5 of the central area 21. It will be understandable that the second area 222 and the fourth area 224 are symmetrically disposed with respect to the central area 21 when the angle α2 is equal to the angle α4.

Figure 3:
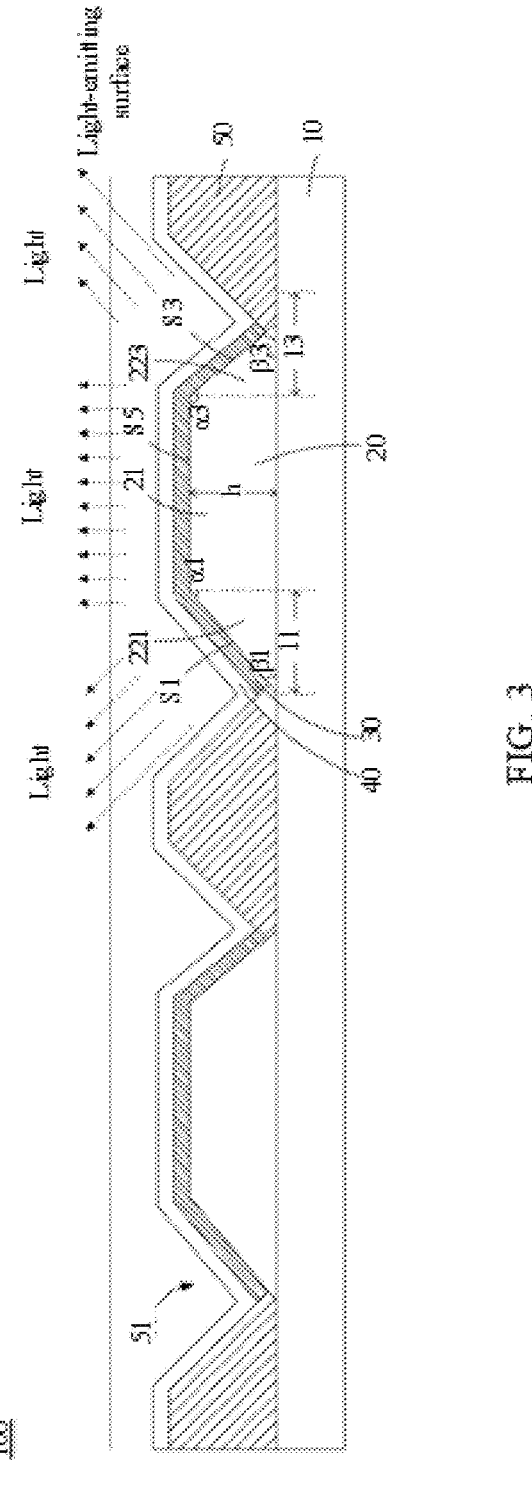
FIG. 3 illustrates a top view of an OLED display panel according to a second embodiment of the present disclosure.

Please refer to FIG. 3. FIG. 3 is a cross-sectional diagram of an organic light-emitting diode (OLED) display panel according to a second preferred embodiment of the present disclosure. In another preferred embodiment of the present disclosure, an angle α1 formed by an upper surface S1 of a first area 221 and an upper surface S5 of a central area 21 is not equal to an angle α3 formed by an upper surface S3 of a third area 223 and the upper surface S5 of the central area 21. It will be appreciated that the first area 221 and the third area 223 are not disposed symmetrically with respect to the central area 21 when the angle α1 is not equal to the angle α3.

For example, the angle α2 formed by the upper surface of the second area 222 and the upper surface S5 of the central area 21 may not be equal to the angle α4 formed by the upper surface of the fourth area 224 and the upper surface S5 of the central area 21, either. It will be appreciated that the second area 222 and the fourth area 224 are not symmetrically disposed with respect to the central area 21 when the angle α2 is not equal to the angle α4.

Figure 4:
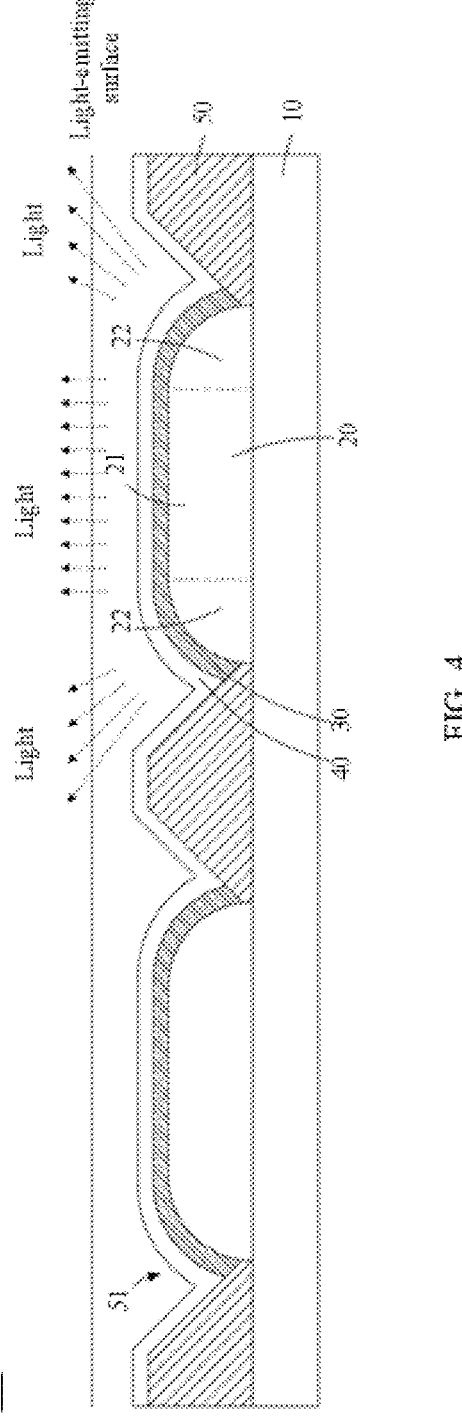
FIG. 4 illustrates a top view of an OLED display panel according to a third embodiment of the present disclosure.

Please refer to FIG. 4. FIG. 4 is a cross-sectional diagram of an organic light-emitting diode (OLED) display panel according to a third preferred embodiment of the present disclosure. In another preferred embodiment of the present disclosure, an upper surface of a peripheral area 22 may be a curved surface. The shape of the curved surface may be a circular arc, an elliptical curve, etc. As illustrated in FIG. 4, when the upper surface of the peripheral area 22 is a curved surface, the light-emitting angle of the light-emitting layer 30 corresponds to different areas of the upper surface of the peripheral area 22 totally differently. Therefore, the range of the light-emitting angle of the light-emitting layer 30 is greatly enlarged, and the visible angle of the OLED display panel 100 is expanded. As shown in FIG. 4, the upper surface of the peripheral area 22 is a curved surface protruding toward the light-emitting layer 30. In another preferred embodiment of the present disclosure, an upper surface of a peripheral area 22 is a curved surface that is depressed toward a driving backplate 10.

The thickness of each of the areas on the light-emitting layer 30 is consistent. In other words, the thickness of the portion of the light-emitting layer 30 covering the central area 21 is equal to the thickness of the portion of the light-emitting layer 30 covering the portion of the peripheral area 22. The shape of the light-emitting surface of the light-emitting layer 30 (i.e., the surface of one side of the light-emitting layer 30 away from the anode 20) is consistent with the shape of the upper surface of the anode 20. Further, the shape of the eminent side of the light-emitting layer 30 is accurately controlled by the shape of the upper surface of the anode 20. In the end, the range of the light-emitting angle of the light-emitting layer 30 and the visible angle of the OLED display panel 100 are both controlled effectively.

Please refer to FIG. 1 and FIG. 2. The OLED display panel 100 may further include a pixel definition layer 50. The pixel definition layer 50 is disposed on the driving backplate 10. An opening S1 is disposed on the pixel definition layer 50. The anode 20 and the light-emitting layer 30 are arranged inside the opening S1. The cathode 40 covers one side of the light-emitting layer 30 away from the driving backplate 10 and one side of the pixel definition layer 50 away from the driving backplate 10.

Please refer to FIG. 5. FIG. 5 is a flowchart of a production method of a liquid crystal display (LCD) display panel, as proposed by the preferred embodiment of the present disclosure, by according to a preferred embodiment of the present disclosure. The production method includes Block S100, Block S200, and Block S300.

Figure 6:
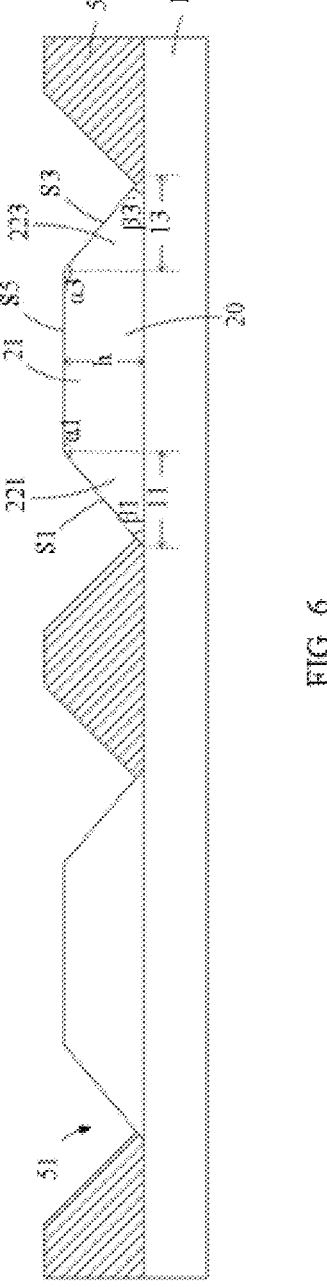
FIG. 6 illustrates a light-emitting layer disposed at a side of an anode away from a driving backplate according to still another embodiment of the present disclosure.

Please refer to FIG. 5 and FIG. 6. At Block S100, a driving backplate 10 is provided, and an anode 20 is arranged at one side of the driving backplate 10. The anode 20 includes a central area 21 and a peripheral area 22. The peripheral area 22 is arranged around the periphery of the central area 21. The surface of one side of the central area 21 away from the driving backplate 10 is defined as an upper surface S5 of the central area 21. The surface of one side of the peripheral area 22 away from the driving backplate 10 is defined as an upper surface of the peripheral area 22. The upper surface S5 of the central area 21 is a flat surface. One portion or more of the upper surface of the peripheral area 22 and one portion or more of the upper surface S5 of the central area 21 are not in parallel.

Please refer to FIG. 1 as well. The distance between the upper surface of the peripheral area 22 and the driving backplate 10 gradually decreases from the side of the peripheral area 22 near the central area 21 to the peripheral area 22 away from the central area 21.

Please refer to FIG. 2 as well. The upper surface S5 of the central area 21, the upper surface S1 of the first area 221, the upper surface of the second area 222, the upper surface S3 of the third area 223, and the upper surface of the fourth area 224 may be all flat surfaces. Besides, the angle α1 formed by the upper surface S1 of the first area 221 and the upper surface S5 of the central area 21, the angle formed by the upper surface of the second area 222 and the upper surface S5 of the central area 21, the angle α3 formed by the upper surface S3 of the third area 223 and the upper surface S5 of the central area 21, and the angle formed by the upper surface of the fourth area 224 and the upper surface S5 of the central area 21 are all blunt angles.

Please refer to FIG. 1 as well. The angle α1 formed by the upper surface S1 of the first area 221 and the upper surface S5 of the central area 21 is equal to the angle α3 formed by the upper surface S3 of the third area 223 and the upper surface S5 of the central area 21.

For example, the angle α2 formed by the upper surface of the second area 222 and the upper surface S5 of the central area 21 is equal to the angle α4 formed by the upper surface of the fourth area 224 and the upper surface S5 of the central area 21.

Please refer to FIG. 3 as well. In another preferred embodiment of the present disclosure, an angle α1 formed by an upper surface S1 of a first area 221 and an upper surface S5 of a central area 21 is not equal to an angle α3 formed by an upper surface S3 of a third area 223 and the upper surface S5 of the central area 21.

The angle α2 formed by the upper surface of the second area 222 and the upper surface S5 of the central area 21 may not be equal to the angle α4 formed by the upper surface of the fourth area 224 and the upper surface S5 of the central area 21, either.

Please refer to FIG. 4 as well. In another preferred embodiment of the present disclosure, an upper surface of a peripheral area 22 may be a curved surface. The shape of the curved surface may be a circular arc, an elliptical curve, etc.

The anode 20 may be produced with a method of magnetron sputtering. The anode 20 may be made from a transparent conductive metal oxide such as indium tin oxide (ITO).

Figure 7:
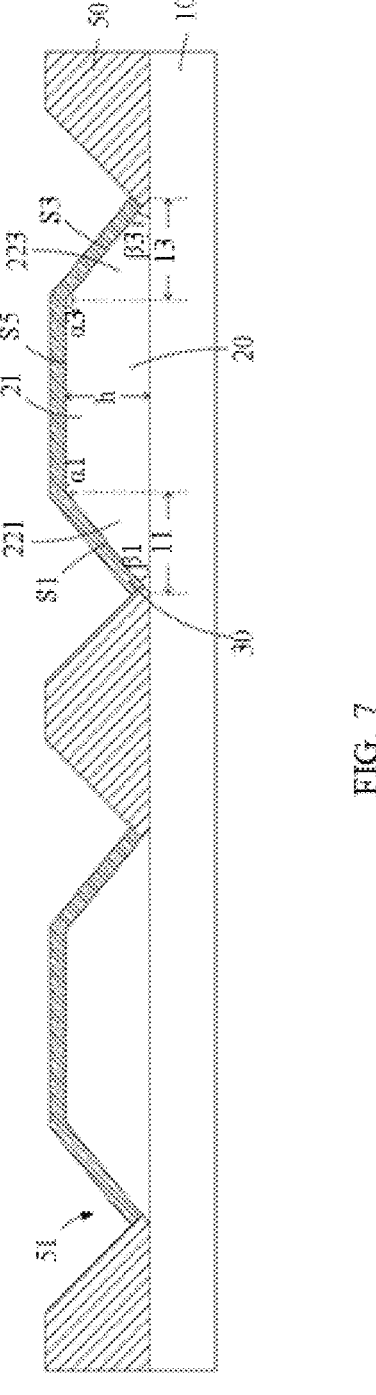
FIG. 7 illustrates a cathode disposed at a side of the light-emitting layer away from the anode according to yet another embodiment of the present disclosure.

Please refer to FIG. 7. At block S200, a light-emitting layer 30 is disposed at one side of the anode 20 away from the driving backplate 10, and the central area 21 and the peripheral area 22 are covered with the light-emitting layer 30.

The thickness of the portion of the light-emitting layer 30 covering the central area 21 is equal to the thickness of the portion of the light-emitting layer 30 covering the portion of the peripheral area 22.

By means of vapor deposition, the light-emitting layer 30 is arranged at one side of the anode 20 away from the driving backplate 10 so that the thickness of each of the areas on the produced light-emitting layer 30 is consistent.

At block S300, a cathode 40 is arranged at one side of the light-emitting layer 30 away from the anode 20.

By means of vapor deposition, the cathode 40 is produced. The cathode 40 may be made from aluminum or an alloy of magnesium and aluminum.

The present disclosure has been described with a preferred embodiment thereof and it is understood that many changes and modifications to the described embodiment can be carried out without departing from the scope and the spirit of the invention that is intended to be limited only by the appended claims.

What is claimed is:

1. An organic light-emitting diode (OLED) display panel, comprising:
   a driving backplate;
   an anode, arranged at a side of the driving backplate;
   a light-emitting layer, disposed at a side of the anode away from the driving backplate;

a cathode, arranged at a side of the light-emitting layer away from the anode;
   wherein the anode comprises a central area and a peripheral area arranged around a periphery of the central area; the light-emitting layer covers the central area and the peripheral area; a surface of a side of the central area away from the driving backplate is defined as an upper surface of the central area; a surface of a side of the peripheral area away from the driving backplate is defined as an upper surface of the peripheral area; one portion or more of the upper surface of the peripheral area and one portion or more of the upper surface of the central area are not in parallel,
   wherein an entirety of a surface of the anode close to the driving backplate is a flat surface, an entirety of the upper surface of the side of an entirety of the peripheral area of the anode away from the driving backplate is a curved surface protruding toward the light-emitting layer, and a thickness of a portion of the light-emitting layer covering the central area is equal to a thickness of a portion of the light-emitting layer covering the peripheral area, and a shape of the surface of one side of the light-emitting layer away from the anode is kept consistent with a shape of the upper surface of the anode away from the driving backplate.

2. The OLED display panel according to claim 1, wherein a distance between the upper surface of the peripheral area and the driving backplate gradually decreases from a side of the peripheral area near the central area to the peripheral area away from the central area.

3. The OLED display panel according to claim 2, wherein the peripheral area comprises a first area, a second area, a third area, and a fourth area; the first area, the second area, the third area, and the fourth area are sequentially connected from a first order to a last order; the first area corresponds to the third area in arrangement; the second area corresponds to the fourth area in arrangement;
   an angle formed by the upper surface of the first area and the upper surface of the central area, an angle formed by the upper surface of the second area and the upper surface of the central area, an angle formed by the upper surface of the third area and the upper surface of the central area, and an angle formed by the upper surface of the fourth area, and the upper surface of the central area are all blunt angles.

4. The OLED display panel according to claim 3, wherein an angle formed by the upper surface of the first area and the driving backplate is equal to an angle formed by the upper surface of the third area and the driving backplate.

5. The OLED display panel according to claim 3, wherein an angle formed by the upper surface of the second area and the driving backplate is equal to an angle formed by the upper surface of the fourth area and the driving backplate.

6. The OLED display panel according to claim 3, wherein an angle formed by an upper surface of the first area and an upper surface of the central area is not equal to an angle formed by an upper surface of the third area and the upper surface of the central area.

7. The OLED display panel according to claim 3, wherein an angle formed by an upper surface of the second area and an upper surface of the central area is not equal to an angle formed by an upper surface of the fourth area and the upper surface of the central area.

8. The OLED display panel according to claim 1, wherein a thickness of a portion of the light-emitting layer covering the central area is equal to a thickness of a portion of the light-emitting layer covering a portion of the peripheral area.

9. The OLED display panel according to claim 1, wherein the OLED display panel further comprises a pixel definition layer disposed on the driving backplate; an opening is disposed on the pixel definition layer; the anode and the light-emitting layer are arranged inside the opening; the cathode covers a side of the light-emitting layer away from the driving backplate and a side of the pixel definition layer away from the driving backplate.

10. A method of producing an organic light-emitting diode (OLED) display panel, comprising:

providing a driving backplate and arranging an anode at a side of the driving backplate, wherein the anode comprises a central area and a peripheral area disposed on a periphery of the central area; the surface of a side of the central area away from the driving backplate is defined as an upper surface of the central area; the surface of a side of the peripheral area away from the driving backplate is defined as an upper surface of the peripheral area; the upper surface of the central area is a flat surface; one portion or more of the upper surface of the peripheral area and one portion or more of the upper surface of the central area are not in parallel;

disposing a light-emitting layer that covers the central area and the peripheral area at a side of the anode away from the driving backplate; and arranging a cathode at a side of the light-emitting layer away from the anode, wherein an entirety of a surface of the anode close to the driving backplate is a flat surface, an entirety of the upper surface of the side of an entirety of the peripheral area of the anode away from the driving backplate is a curved surface protruding toward the light-emitting layer, and a thickness of a portion of the light-emitting layer covering the central area is equal to a thickness of a portion of the light-emitting layer covering the peripheral area, and a shape of the surface of one side of the light-emitting layer away from the anode is kept consistent with a shape of the upper surface of the anode away from the driving backplate.

11. The method according to claim 10, further comprising:

disposing the light-emitting layer at the side of the anode away from the driving backplate by means of vapor deposition, so that a thickness of a portion of the light-emitting layer covering the central area is equal to a thickness of a portion of the light-emitting layer covering a portion of the peripheral area.

12. The method according to claim 10, wherein a distance between the upper surface of the peripheral area and the driving backplate gradually decreases from a side of the peripheral area near the central area to the peripheral area away from the central area.

13. The method according to claim 12, wherein the peripheral area comprises a first area, a second area, a third area, and a fourth area; the first area, the second area, the third area, and the fourth area are sequentially connected from a first order to a last order; the first area corresponds to the third area in arrangement; the second area corresponds to the fourth area in arrangement;

an angle formed by the upper surface of the first area and the upper surface of the central area, an angle formed by the upper surface of the second area and the upper surface of the central area, an angle formed by the upper surface of the third area and the upper surface of the central area, and an angle formed by the upper surface of the fourth area, and the upper surface of the central area are all blunt angles.

14. The method according to claim 13, wherein an angle formed by the upper surface of the first area and the driving backplate is equal to an angle formed by the upper surface of the third area and the driving backplate.

15. The method according to claim 13, wherein an angle formed by the upper surface of the second area and the driving backplate is equal to an angle formed by the upper surface of the fourth area and the driving backplate.

16. The method according to claim 13, wherein an angle formed by an upper surface of the first area and an upper surface of the central area is not equal to an angle formed by an upper surface of the third area and the upper surface of the central area.

17. The method according to claim 13, wherein an angle formed by an upper surface of the second area and an upper surface of the central area is not equal to an angle formed by an upper surface of the fourth area and the upper surface of the central area.

18. The method according to claim 10, wherein a shape of the curved surface is a circular arc or an elliptical curve.

* * * * *